(12) United States Patent
Yamamoto (10) Patent No.: US 7,615,321 B2
(45) Date of Patent: Nov. 10, 2009

(54) COLOR FILTER

(75) Inventor: Manabu Yamamoto, Tokyo (JP)

(73) Assignee: Dai Nippon Printing Co., Ltd., Tokyo-to (JP)

( * ) Notice: Subject to any disclaimer, the term of this patent is extended or adjusted under 35 U.S.C. 154(b) by 0 days.

(21) Appl. No.: 11/445,397

(22) Filed: Jun. 1, 2006

(65) Prior Publication Data

US 2007/0146914 A1 Jun. 28, 2007

(30) Foreign Application Priority Data

Jun. 3, 2005 (JP) ............................. 2005-163857

(51) Int. Cl.
*G02B 5/20* (2006.01)
(52) U.S. Cl. .......................................... 430/7; 347/106
(58) Field of Classification Search ........................ None
See application file for complete search history.

(56) References Cited

U.S. PATENT DOCUMENTS

| | | | |
|---|---|---|---|
| 6,450,635 B1 * | 9/2002 | Okabe et al. | 347/106 |
| 6,630,274 B1 * | 10/2003 | Kiguchi et al. | 430/7 |
| 2004/0197682 A1 * | 10/2004 | Sonehara et al. | 430/7 |

FOREIGN PATENT DOCUMENTS

| | | | |
|---|---|---|---|
| JP | 2001-074928 | | 3/2001 |
| JP | 2004-327357 A | * | 11/2004 |
| JP | 2005-283892 A | * | 10/2005 |

OTHER PUBLICATIONS

Computer-generated translation of JP 2004-327357 (Nov. 2004).*

* cited by examiner

*Primary Examiner*—John A. McPherson
(74) *Attorney, Agent, or Firm*—Ladas & Parry LLP (57) ABSTRACT

A main object of the present invention is to provide a high-quality color filter wherein the shapes of colored layer, as individual pixels, are even in the whole. To achieve the object, the present invention provides a color filter comprising: a base material; a light shielding part formed on the base material and containing a light shielding material and a resin; a photocatalyst containing layer formed to cover the base material and the light shielding part and containing a photocatalyst and an organopolysiloxane; and a colored layer formed on the photocatalyst containing layer in opening portions made in the light shielding part, wherein regarding ten pixels out of its pixels, the film thickness of a maximum film thickness portion where the film thickness from the surface of the base material to the surface of the colored layer in the opening portion in the pixel is maximum and the film thickness of a minimum film thickness portion where the film thickness from the surface of the base material to the surface of the colored layer in the opening portion is minimum are measured in each pixel, and the ratio α between the average A of the film thicknesses of the maximum film thickness portions and the average B of the film thicknesses of the minimum film thickness portions in the ten pixels (=B/A) is in the range of 0.5 to 1.0.

2 Claims, 4 Drawing Sheets

COLOR FILTER

BACKGROUND OF THE INVENTION

1. Field of the Invention

The present invention relates to a color filter which is obtained by coloring a colored layer with an ink jet method and is suitable for a color liquid crystal display.

2. Description of the Related Art

Recently, with the development of the personal computers, in particular, the development of the portable personal computers, demand for liquid crystal displays, especially for color liquid crystal displays tends to be increased. Further, bigger liquid crystal displays are in demand. However, the color liquid displays are expensive; therefore, a request that the cost should be reduced has been increasing. In particular, a request that the cost of their color filters, which accounts for a high ratio in the total cost, should be reduced has been raised.

Such color filters, in general, comprise colored patterns of three primary colors of red (R), green (G) and blue (B) so that liquid crystals are operated as a shutter by switching on or off the electrodes each corresponding to the pixels of R, G and B. Thereby, color display can be provided according to light transmission to the each pixel of R, G and B.

The color filter producing method which has been hitherto performed is, for example, a dye method. In this dye method, a water-soluble polymer which is a material for dyeing is first produced on a glass substrate, patterned into a desired shape in a photolithographic step, and then the resultant pattern is immersed into a dyeing bath to yield a colored pattern. This is repeated three times, thereby forming color filter layers in R, G and B.

Another example of the producing method is a pigment dispersion method. In this method, a photosensitive resin layer wherein a pigment is dispersed is first formed on a substrate, and patterned to yield a mono-colored pattern. This step is further repeated three times, thereby forming color filter layers in R, G and B.

Different examples of the method include an electrode positing method, and a method of dispersing R, G and B pigments in thermosetting resins, respectively, performing printing for R, G and B three times, and then thermosetting the resins. However, according to the methods, in any case, the same step should be repeated for three times for coloring the three colors of R, G and B so that problems are involved in that the cost is increased or the yield is lowered due to the repetition of the steps.

Figure 4:
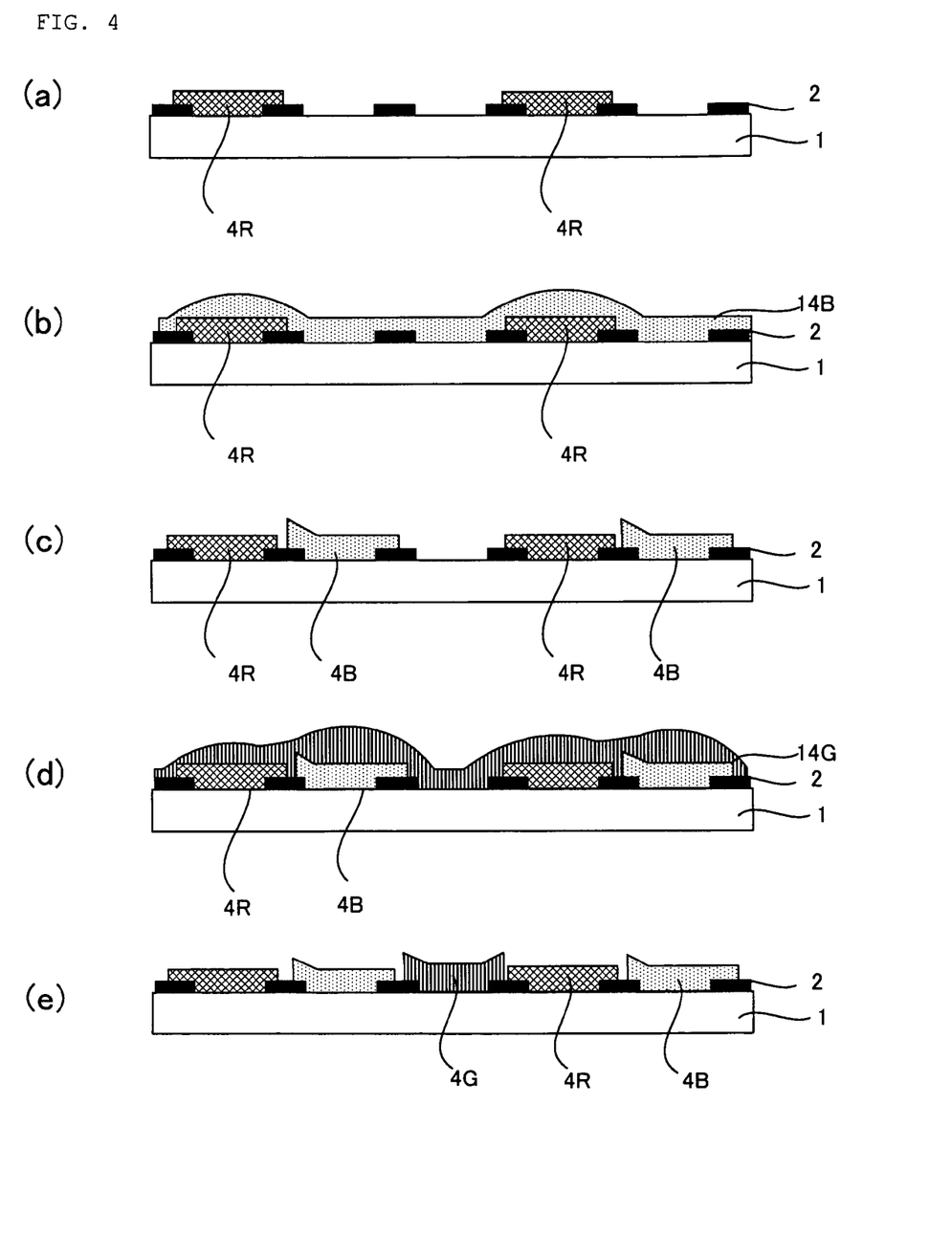
FIGS. 4A to 4E are each a schematic sectional view illustrating a conventional color filter.

In such methods in particular, when plural colored layers in red (R), green (G), blue (B) and so forth are formed on a transparent substrate wherein a light shielding part is formed, it is difficult to form the colored layers into even shapes on the entire surface of a color filter. As illustrated in FIGS. 4A to 4E, a color layer 4R for a first color is formed in the opening portions made in a transparent substrate 1, on which a light shielding part 2 is formed, by such as photolithography method, so as to cover the light shielding part 2 partially (FIG. 4A). Subsequently, a colored layer forming coating solution 14B, for second colored layer formation, is applied onto the transparent substrate 1 on which the colored layer 4R is formed (FIG. 4B), and then the applied solution in only target regions is cured to form a colored layer 4B (FIG. 4C). At the time of applying the colored layer forming coating solution 14B, in the vicinities of the regions where the colored layer 4R is formed, the film thickness of the colored layer forming coating solution 14B applied onto the vicinities becomes large since the colored layer 4R is already formed on the transparent base material 1. Accordingly, the film thickness of the colored layer 4R side of the colored layer 4B, which is formed by curing the colored layer forming coating solution 14B, becomes larger than the film thickness of the colored layer 4R. When a colored layer forming coating solution 14G, for third colored layer formation, is applied (FIG. 4D), the colored layers 4R and 4G are already formed adjacently to regions where the third colored layer is to be formed; therefore, the film thickness of the film of the colored layer forming coating solution 14G becomes large in the vicinities of the colored layers 4R and 4G. Thus, when the coating solution 14G is cured to form a colored layer 4G, the film thickness of the colored layer 4G becomes larger at both end portions thereof than those of the colored layers 4R and 4B (FIG. 4E). Consequently, color unevenness is generated between the individual pixels. Moreover, even the pixels in the same color have different film thicknesses in accordance with the positions of the pixels in the color filter; it is therefore difficult to attain even color display in the whole of the color filter.

In the meantime, the applicant has been investigating a method for producing a color filter, including the steps of using a property changeable pattern forming coating solution containing a photocatalyst and a material having a property changed by the action of a photocatalyst accompanied by energy radiation to form a photocatalyst containing layer, exposing the resultant in a pattern form to light, so as to form a pattern with the property changed, and then forming a colored layer by such as an ink jet method (Japanese Patent Application Laid-Open No. 2001-074928). According to this method, the property of the photocatalyst containing layer is used to make it possible to form a colored layer easily.

Figure 5:
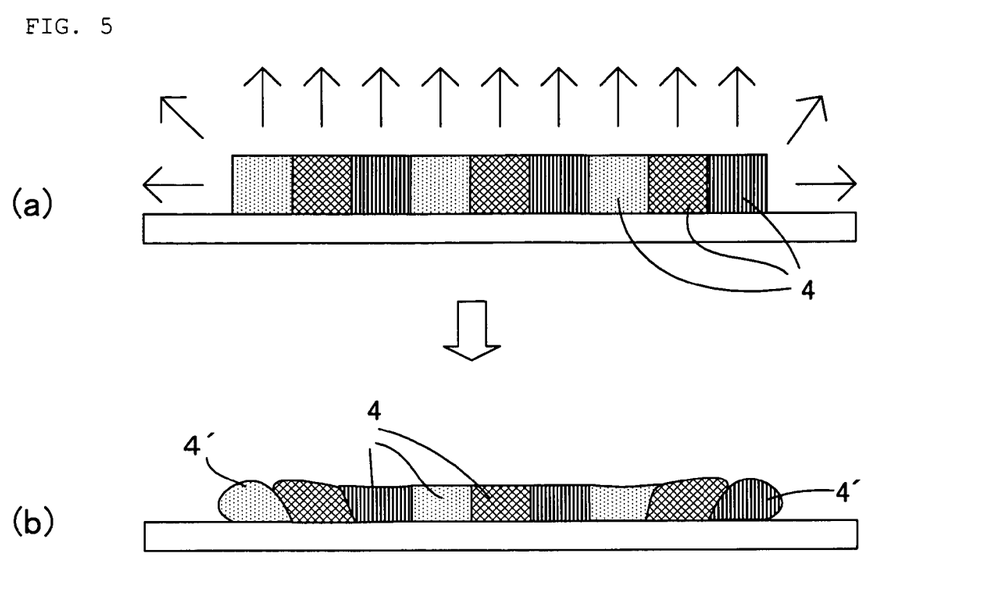
FIGS. 5A and 5B are each a schematic sectional view illustrating a conventional color filter.

According to such a method also, however, as illustrated in FIG. 5B, the shapes of pieces of a colored layer 4 in pixels in the central portion of a color filter are different from the shapes of pieces of a colored layer 4' in outer side pixels of the color filter in many cases, depending on, for example, conditions for drying the colored layer forming coating solution dropped by such as an ink jet method. As illustrated in FIG. 5A, at the time of applying the colored layer forming coating solution, in the regions near the outside of the color filter, the solvent in this coating solution volatilizes upwards and toward end portions of the color filter. Consequently, in the regions near the outside of the color filter, the solvent in the atmosphere is lower in saturation degree and volatilization thereof advances further than in the central portion of the color filter. For this reason, as the volatilization of the solvent advances, the colored layer forming coating solution moves to the outer side so that the colored layer 4 is solidified in the state that the colored layer 4 deforms so as to be inclined outside, as illustrated in FIG. 5B. As a result thereof, in the whole of the color filter, the shape of the colored layer 4 in the individual pixels is not even. Thus, when the color filter is used in a liquid crystal display, even color display cannot be attained in the whole thereof.

SUMMARY OF THE INVENTION

Accordingly, it is desired to provide a high-quality color filter wherein the shapes of colored layer, as individual pixels, are even in the whole.

The present invention provides a color filter comprising: a base material; a light shielding part formed on the base material and containing a light shielding material and a resin; a photocatalyst containing layer formed to cover the base material and the light shielding part and containing a photocatalyst and an organopolysiloxane; and a colored layer formed on the photocatalyst containing layer in an opening portion made in the light shielding part, wherein regarding ten pixels out of its pixels, the film thickness of a maximum film thickness portion where the film thickness from the surface of the base material to the surface of the colored layer in the opening portion in the pixel is maximum and the film thickness of a minimum film thickness portion where the film thickness from the surface of the base material to the surface of the colored layer in the opening portion is minimum are measured in each pixel, and the ratio α between the average A of the film thicknesses of the maximum film thickness portions and the average B of the film thicknesses of the minimum film thickness portions in the ten pixels (=B/A) is in the range of 0.5 to 1.0.

According to the invention, in the individual pixels, the ratio a between the average A of the film thicknesses of the maximum film thickness portions in their opening portion and the average B of the film thicknesses of the minimum film thickness portions in their opening portion is within the predetermined range. Accordingly, the shape of the colored layer in the individual pixels can be made substantially even in the whole of the color filter. Furthermore, when the color filter is used in a liquid crystal display, this color filter is a high-quality color filter wherein color unevenness or the like is not present in its pixels.

In the invention, the photocatalyst containing layer containing the photocatalyst and the organopolysiloxane is formed; accordingly, when the colored layer is formed, energy is radiated to the photocatalyst containing layer in a region where the colored layer is to be formed, the contact angle of the region with respect to a liquid can be made lower. Thus, the invention also has an advantage that by use of this wettability difference in this photocatalyst containing layer, the colored layer can easily be formed by, for example, an ink jet method.

DESCRIPTION OF THE PREFERRED EMBODIMENT

The present invention relates to a color filter which is obtained by coloring a colored layer with an ink jet method and is suitable for a color liquid crystal display. The following will explain separately the color filter of the invention and a method for producing the same.

A. Color Filter

First, the color filter of the present invention will be explained. The color filter of the present invention comprises: a base material; a light shielding part formed on the base material and containing a light shielding material and a resin; a photocatalyst containing layer formed to cover the base material and the light shielding part and containing a photocatalyst and an organopolysiloxane; and a colored layer formed on the photocatalyst containing layer in opening portions made in the light shielding part, wherein regarding ten pixels out of its pixels, the film thickness of a maximum film thickness portion where the film thickness from the surface of the base material to the surface of the colored layer in the opening portion in the pixel is maximum and the film thickness of a minimum film thickness portion where the film thickness from the surface of the base material to the surface of the colored layer in the opening portion is minimum are measured in each pixel, and the ratio α between the average A of the film thicknesses of the maximum film thickness portions and the average B of the film thicknesses of the minimum film thickness portions in the ten pixels (=B/A) is in the range of 0.5 to 1.0.

Figure 1:
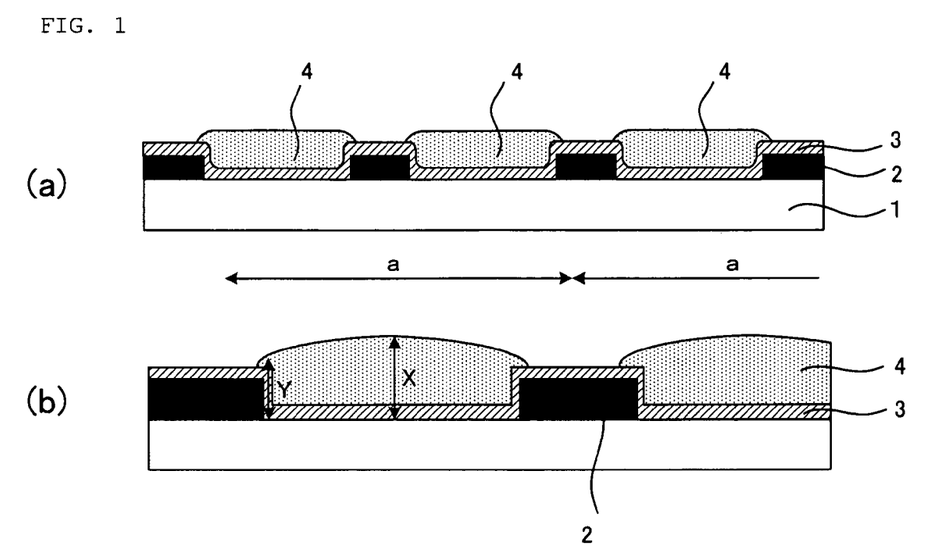
FIGS. 1A and 1B are each an explanatory view illustrating an example of the color filter of the invention.

As illustrated in, for example, FIG. 1A, the color filter of the invention is a color filter having a base material 1; a light shielding part 2 formed on the base material 1; a photocatalyst containing layer 3 formed on the light shielding part 2; and a colored layer 4 formed on the photocatalyst containing layer 3. Further, in the color filter of the invention, in the case of measuring, regarding ten pixels out of its pixels a, the film thickness X of a maximum film thickness portion where the film thickness from the surface of the base material 1 to the surface of the colored layer 4 in an opening portion in the light shielding part 2 is maximum and the film thickness Y of a minimum film thickness portion where the film thickness from the surface of the base material 1 to the surface of the colored layer 4 in the opening portion in the light shielding part 2 is minimum as illustrated in FIG. 1B, and then calculating the average A of Xs in the ten pixels and the average B of Ys in the ten pixels, the ratio α therebetween (=B/A) is in the predetermined range.

In any ordinary color filter, the shapes of colored layer in individual pixels are different from each other correspondingly to individual colors of the pixels, or the shapes of the pixels in the central portion of the color filter being different from those of the pixels in the end portion of the color filter, as explained above. Therefore, when the color filter is used in a liquid crystal display, even color display cannot be attained in the whole of the color filter.

On the other hand, in the invention, the ratio between the average A of the film thicknesses of the maximum film thickness portions and the average B of the film thicknesses of the minimum film thickness portions is within the predetermined range; it is therefore possible that a variation in the shapes of the individual colored layer can be made small in the whole of the color filter. Accordingly, in the invention, at the time of using the color filter in a liquid crystal display, the color filter can be made a high-quality color filter wherein even color display can be attained in the whole of regions. The ten pixels are selected optionally from all of the pixels of the color filter. The film thickness of each of the maximum film thickness portions and that of each of the minimum film thickness portions can be obtained, for example, by photographing sectional shapes of the colored layer with a scanning electron microscope (SEM) to calculate the thicknesses from the resultant photograph, or measuring the film thicknesses with a stylus film thickness meter.

Specifically, the value of α is in the range from 0.5 to 1.0, preferably from 0.7 to 1.0, more preferably from 0.8 to 1.0. In this manner, variation in the shapes of the colored layer in the individual pixels can be made less. As the difference between the maximum film thickness and the minimum film thickness is smaller in each of the pixels, color unevenness of the colored layer in the individual pixels can be made small.

Since the photocatalyst containing layer contains the photocatalyst and the organopolysiloxane in the invention, the wettability of the surface is partially changed by the action of the photocatalyst accompanied by energy radiation. By use of this wettability difference, the colored layer can easily be formed by such as an ink jet method.

Such a wettability difference in the photocatalyst containing layer is used to form a colored layer, whereby a colored layer forming coating solution, for colored layer formation, neither wets nor spreads onto the photocatalyst containing layer with no wettability changed so that a constant supply amount of the colored layer forming coating solution can be applied onto each of the pixels. As a result, by adjusting drying conditions or the like, the shape of the colored layer in the individual pixels in the whole of the color filter can easily be made even.

The following will explain each of the constituents of the color filter of the invention in detail.

1. Colored Layer

First, the colored layer used in the color filter of the invention is explained. The colored layer is not particularly limited as long as the layer is a layer: formed on the photocatalyst containing layer that will be detailed later; formed to cover opening portions in the light shielding part and some portions of the light shielding part; and formed into substantially the same shape inside each of the pixels in the color filter.

The film thickness of the maximum film thickness portion in each of the opening portions is appropriately selected in accordance with the kind or usage of the color filter, and other factors, and is usually from 1.6 to 3.0 µm, preferably from 1.7 to 2.8 µm, more preferably 1.8 to 2.5 µm. In any ordinary colored layer, a pigment, a binder and so forth are contained, and the content of the pigment in the colored layer, the ratio by weight of P (pigment)/V (binder) is set into the range from about 0.2 to 0.4, preferably set to about 0.3 because the film thickness is made thin. Accordingly, in order for the colored layer of the invention to achieve its original function, the film thickness thereof is required to be a film thickness in the above-mentioned range.

An ordinary colored layer is formed to cover the opening portions in a light shielding part and some portions of the light shielding part. In the invention, it is preferable that the colored layer is formed to cover the light shielding part by about 5 to 30 µm, in particular, about 10 to 20 µm from the end portions of the light shielding part. By forming the colored layer to cover the end portions of the light shielding part, the film thickness of the colored layer is prevented from being made small near the boundaries between the light shielding part and the opening portions. Thus, the above-mentioned difference between the maximum film thickness portion and the minimum film thickness portion can be realized.

The colored layer is usually composed of three colors of red (R), green (G) and blue (B). In the invention, the type of the colored pattern in this colored layer may be a known arrangement type, such as a stripe type, a mosaic type, a triangle type or a 4-pixel arrangement type. The colored area can be set at will.

The formation of the colored layer having an even shape in the whole of the color filter can be attained as explained above by adjusting regions wherein the wettability of the photocatalyst containing layer is changed in such a manner that the colored layer will cover end portions of the light shielding part, and using this wettability difference in the photocatalyst containing layer to apply the colored layer forming coating solution for colored layer formation, in a constant supply amount, to each of the pixels by the ink jet method or the like.

In the invention, the contact angle of the photocatalyst containing layer with respect to a liquid is lowered by the action of the photocatalyst accompanied by energy radiation, and the wettability difference between energy radiated parts and energy non-radiated parts can be made more than a predetermined value. Accordingly, when the colored layer forming coating solution, for colored layer formation, is applied in a constant supply amount to each of regions where the colored layer is to be formed, that is, each of opening portions in the light shielding part, the colored layer neither wets and spreads outside regions where the colored layer is to be formed, so that the colored layer can be formed as a colored layer with pixels having an even shape. By using the constant supply amount, the difference between the maximum film thickness and the minimum film thickness can be set into the above-mentioned range.

The method of using the wettability difference in the photocatalyst containing layer in this way to apply the colored layer forming coating solution is not particularly limited as long as the method is a method capable of applying the colored layer forming coating solution in a constant supply amount to each of the pixels. In the invention, it is particularly preferable to form the colored layer by an ink jet method. This makes it possible to apply the colored layer forming coating solution onto each of the colored layer with a changed wettability in a constant supply amount, and form the colored layer highly precisely.

In the invention, it is also preferable that after the application of the colored layer forming coating solution by a method as explained above, conditions for drying this coating solution or other conditions are adjusted. This makes it possible to obtain the colored layer having an evener shape in the individual pixels.

An example of such method for drying the colored layer forming coating solution is a method of applying the same solvent as contained in this coating solution to the vicinities of the colored layer near the outside of the color filter, thereby adjusting the volatilization rate of the solvent in the individual regions. In this method, at the time of volatilizing the solvent and so forth contained in the colored layer forming coating solution after the application of the coating solution, in regions near the outside of the color filter, the saturation degree of the solvent in the atmosphere is low so that the volatilization advances more speedy. Thus, as the volatilization of the solvent advances, the colored layer forming coating solution moves outwards.

Another example of the drying method is a method of arranging partitions in the vicinities of the colored layer in regions near the outside of the color filter to prevent the solvent from volatilizing outwards, thereby adjusting the volatilization rate of the solvent. A different example thereof is a method of sending air from the outside to the inside of the color filter at the time of the drying, thereby making the shapes of the colored layer in the individual pixels even.

The colored layer forming coating solution used in an ink jet method is roughly classified into aqueous ink and oily ink. In the invention, anyone of the inks may be used. It is preferable to use an aqueous colored layer forming coating solution, the base of which is water, from the viewpoint of surface tension.

In the aqueous colored layer forming coating solution used in the invention, as the solvent therein, water alone or a mixed solvent of water and a water-soluble organic solvent can be used. In the oil based colored layer forming coating solution, a solvent made mainly of a high boiling point solvent is preferably used in order to prevent the head to be used from being blocked and the like. Examples of the coloring agent used in the colored layer forming coating solution of the ink jet method include a generally known pigments and dyes. In order to improve the dispersibility or fixability thereof, a soluble or insoluble resin may be incorporated into the solvent. Besides, the following may be added thereto if necessary: a surfactant such as a nonionic surfactant, a cationic surfactant or an amphoteric surfactant; a preservative; an antifungal agent; a pH adjustor; an antifoaming agent; an ultraviolet absorber; a viscosity adjustor; and a surface tension adjustor.

Since the ordinary ink-jetting ink has a low suitable-viscosity, the ink cannot contain a large amount of a binder; however, the particles of the coloring agent in the colored layer forming coating solution is made into particles encapsulated with a resin, whereby the coloring agent itself can be caused to have fixability. Such a colored layer forming coating solution can also be used in the invention. Furthermore, what is called hot melt ink type or UV curable ink type of colored layer forming coating solution can also be used.

In the invention, it is particularly preferable to use a curable colored layer forming coating solution. It is more preferable to use a UV curable colored layer forming coating solution containing at least an ultraviolet curable resin and a dye or pigment, or a thermosetting colored layer forming coating solution containing a thermosetting resin and a dye or pigment.

The use of the UV curable colored layer forming coating solution makes it possible to rapidly curing the colored layer forming coating solution by radiating UV onto the solution, after the solution is colored by the ink jet method to form a colored layer. Thus, the resultant can be immediately forwarded to the next step. Accordingly, a color filter can be effectively produced.

The material used in the UV curable colored layer forming coating solution is, for example, a material made mainly of a prepolymer, a monomer, a photopolymerization initiator, and the coloring agent. As the prepolymer, any one of the following prepolymers can be used without any especial limitation: a polyester acrylate, a polyurethane acrylate, an epoxy acrylate, a polyether acrylate, an oligo-acrylate, an alkyd acrylate, a polyol acrylate, a silicone acrylate, and others.

As the monomer, the following can be used: a vinyl monomer such as a styrene or a vinyl acetate; a mono functional acrylic monomer such as an n-hexyl acrylate or a phenoxyethyl acrylate; or a polyfunctional acrylic monomer such as a diethylene glycol diacrylate, a 1,6-hexanediol diacrylate, a hydroxypiperinic acid ester neopentyl glycol diacrylate, a trimethylolpropane triacrylate, or a dipentaerythritol hexaacrylate. The prepolymers and the monomers may be used alone or in combination of two or more thereof.

As the photopolymerization initiator, a photopolymerization initiator that is selected from the following and can give a desired curing property can be used: an isobutyl benzoin ether, an isopropyl benzoin ether, a benzoin ethyl ether, a benzoin methyl ether, a 1-phenyl-1,2-propanedione-2-oxime, a 2,2-dimethoxy-2-phenylacetophenone, a benzil, a hydroxycyclohexyl phenyl ketone, a diethoxyacetophenone, a 2-hydroxy-2-methyl-l-phenylpropane-l-one, a benzophenone, a chlorothioxanthone, a 2-chlorothioxanthone, an isopropylthioxanthone, a 2-methylthioxanthone, a chlorine-substitutedbenzophenone, a halogen-substituted alkyl allyl ketone, and others. If necessary, a photopolymerization-initiating auxiliary, such as an aliphatic amine or an aromatic amine, or a photo-sensitizer such as a thioxanthone may be added.

The thermosetting colored layer forming coating solution is characterized by containing at least a binder and a bifunctional or trifunctional epoxy-containing monomer. The thermosetting colored layer forming coating solution used in the invention may optionally contain a coloring agent, a dispersing agent, a curing promoter, or other additives. In order to give an appropriate fluidity or discharging property to the thermosetting colored layer forming coating solution, the above-mentioned individual components may be dissolved or dispersed in a solvent (diluting agent). The thermosetting colored layer forming coating solution used in the invention is a solution wherein a tetra- or higher-order functional epoxy-containing resin is combined with the bi- or tri-functional epoxy-containing monomer in the above-mentioned thermosetting colored layer forming coating solution.

The binder may be anyone of a resin having no polymerization reactivity by itself and a resin having polymerization reactivity by itself. A combination of two or more binders may be used.

In the case of using, for example, a resin having no polymerization reactivity as the binder, the bifunctional or trifunctional epoxy-containing monomer or some other thermosetting component in the thermosetting colored layer forming coating solution is heated to be polymerized and cured. As such an unpolymerized binder, the following can be used as examples: a copolymer made from two or more selected from an acrylic acid, a methacrylic acid, a methyl acrylate, a methyl methacrylate, a 2-hydroxyethyl acrylate, a 2-hydroxyethyl methacrylate, a benzyl acrylate, a benzyl methacrylate, a styrene, a polystyrene macromonomer, and a polymethyl methacrylate macromonomer.

More specifically, an acrylic acid copolymer as follows can be used as examples: an acrylic acid/benzyl acrylate copolymer, an acrylic acid/methyl acrylate/styrene copolymer, an acrylic acid/benzyl acrylate/styrene copolymer, an acrylic acid/methyl acrylate/polystyrene macromonomer copolymer, an acrylic acid/methyl acrylate/polymethyl methacrylate macromonomer copolymer, an acrylic acid/benzyl acrylate/polystyrene macromonomer copolymer, an acrylic acid/benzyl acrylate/polymethyl methacrylate macromonomer copolymer, an acrylic acid/2-hydroxyethyl acrylate/benzyl acrylate/polystyrene macromonomer copolymer, an acrylic acid/2-hydroxyethyl acrylate/benzyl acrylate/polymethyl methacrylate macromonomer copolymer, an acrylic acid/benzyl methacrylate copolymer, an acrylic acid/methyl methacrylate/styrene copolymer, an acrylic acid/benzyl methacrylate/styrene copolymer, an acrylic acid/methyl methacrylate/polystyrene macromonomer copolymer, an acrylic acid/methyl methacrylate/polymethyl methacrylate macromonomer copolymer, an acrylic acid/benzyl methacrylate/polystyrene macromonomer copolymer, an acrylic acid/benzyl methacrylate/polymethyl methacrylate macromonomer copolymer, an acrylic acid/2-hydroxyethyl methacrylate/benzyl methacrylate/polystyrene macromonomer copolymer, or an acrylic acid/2-hydroxyethyl methacrylate/benzyl methacrylate/polymethyl methacrylate macromonomer copolymer.

Furthermore, a methacrylic acid copolymer as follows can be used as examples: a methacrylic acid/benzyl acrylate copolymer, a methacrylic acid/methyl acrylate/styrene copolymer, a methacrylic acid/benzyl acrylate/styrene copolymer, a methacrylic acid/methyl acrylate/polystyrene macromonomer copolymer, a methacrylic acid/methyl acrylate/polymethyl methacrylate macromonomer copolymer, a methacrylic acid/benzyl acrylate/polystyrene macromonomer copolymer, a methacrylic acid/benzyl acrylate/polymethyl methacrylate macromonomer copolymer, a methacrylic acid/2-hydroxyethyl acrylate/benzyl acrylate/polystyrene macromonomer copolymer, a methacrylic acid/2-hydroxyethyl acrylate/benzyl acrylate/polymethyl methacrylate macromonomer copolymer, a methacrylic acid/benzyl methacrylate copolymer, a methacrylic acid/methyl methacrylate/ styrene copolymer, a methacrylic acid/benzyl methacrylate/styrene copolymer, a methacrylic acid/methyl methacrylate/polystyrene macromonomer copolymer, a methacrylic acid/methyl methacrylate/polymethyl methacrylate macromonomer copolymer, a methacrylic acid/benzyl methacrylate/polystyrene macromonomer copolymer, a methacrylic acid/benzyl methacrylate/polymethyl methacrylate macromonomer copolymer, a methacrylic acid/2-hydroxyethyl methacrylate/benzyl methacrylate/polystyrene macromonomer copolymer, or a methacrylic acid/2-hydroxyethyl methacrylate/benzyl methacrylate/polymethyl methacrylate macromonomer copolymer.

Of the above-mentioned unpolymerized binders, preferred are the methacrylic acid/benzyl methacrylate copolymer, the methacrylic acid/benzyl methacrylate/styrene copolymer, the benzyl methacrylate/styrene copolymer, the benzyl methacrylate macromonomer/styrene copolymer, the benzyl methacrylate/styrene macromonomer copolymer, and so forth.

In the meantime, the binder having polymerizability by itself may be an oligomer or a polymer having a larger molecular weight than the oligomer wherein a thermally polymerizable functional group such as an epoxy group is introduced into a polymerized binder. About molecules of the polymerizable binder, the binder molecules are polymerized with each other, and further the binder molecules are polymerized together with the bifunctional or trifucntional monomer, or a different polymerizable monomer so as to be thermally cured.

As the binder having thermally polymerization, the following can be used as examples: a homopolymer or a copolymer obtained by polymerizing one or more selected from monomers each having an ethylenic unsaturated bond and an epoxy group, for example, (meth)acrylates such as a glycidyl acrylate, a glycidyl methacrylate, a glycidyl α-ethylacrylate, a glycidyl α-n-propylacrylate, a glycidyl α-n-butylacrylate, a 3,4-epoxybutyl acrylate, a 3,4-epoxybutyl methacrylate, a 4,5-epoxypentyl methacrylate, a 6,7-epoxyheptyl acrylate, a 6,7-epoxyheptyl methacrylate, and a 6,7-epoxyheptyl α-ethylacrylate; vinyl glycidyl ethers such as a o-vinylphenyl glycidyl ether, a m-vinylphenyl glycidyl ether, a p-vinylphenyl glycidyl ether, a o-vinylbenzyl glycidyl ether, a m-vinylbenzyl glycidyl ether, and a p-vinylbenzyl glycidyl ether; and a 2,3-diglycidyloxystyrene, a 3,4-diglycidyloxystyrene, a 2,4-diglycidyloxystyrene, a 3,5-diglycidyloxystyrene, a 2,6-diglycidyloxystyrene, a 5-vinylpyrogallol triglycidyl ether, a 4-vinylpyrogallol triglycidyl ether, a vinylfluoroglycinol triglycidyl ether, a 2,3-dihydroxymethylstyrene diglycidyl ether, a 3,4-dihydroxymethylstyrene diglycidyl ether, a 2,4-dihydroxymethylstyrene diglycidyl ether, a 3,5-dihydroxymethylstyrene diglycidyl ether, a 2,6-dihydroxymethylstyrene diglycidyl ether, a 2,3,4-trihydroxymethylstyrene triglycidyl ether, and a 1,3,5-trihydroxymethylstyrene triglycidyl ether.

A copolymer obtained by polymerizing one or more selected from monomers each having an ethylenic unsaturated bond and an epoxy group, as explained above, and a monomer containing no epoxy group, as explained below, can also be used as the thermally polymerizable binder. Examples of the monomer containing no epoxy group include an acrylic acid, a methacrylic acid, a methyl acrylate, a methyl methacrylate, a 2-hydroxyethyl acrylate, a 2-hydroxyethyl methacrylate, a benzyl acrylate, a benzyl methacrylate, a styrene, a polystyrene macromonomer, and a polymethyl methacrylate macromonomer.

The binder is usually blended at a ratio of 1 to 50% by weight of the whole of solid contents in the thermosetting colored layer forming coating solution. The solid contents in the thermosetting colored layer forming coating solution, which are explained herein to specify the blend ratio, are all components other than the solvent(s) in the solid solution, which include the polymerizable monomer(s) in a liquid form also.

2. Photocatalyst Containing Layer

Next, the photocatalyst containing layer used in the invention is explained. The photocatalyst containing layer is not particularly limited as long as the layer is a layer which contains a photocatalyst and an organopolysiloxane and is formed to cover the base material and the light shielding part that will be detailed later. Usually, in the photocatalyst containing layer, photocatalyst fine particles are formed in a state of a mixture wherein the particles are partially or entirely covered with the organopolysiloxane. The photocatalyst fine particles are partially exposed to the surface.

Moreover, since the organopolysiloxane is contained in the photocatalyst containing layer, the surface wettability can be changed by the action of the photocatalyst at the time of the energy radiation so that the area with the energy radiation can be provided as a lyophilic region, and the area without the energy radiation as a liquid repellent region.

According to the present invention, in the part without the energy radiation, that is, in the liquid repellent region, it is preferable that the contact angle with respect to a liquid having 40 mN/m surface tension is 10° or more, preferably the contact angle with respect to a liquid having a 30 mN/m surface tension is 10° or more, and particularly preferably the contact angle with respect to a liquid having a 20 mN/m surface tension is 10° or more. Since the part without the energy radiation is the part required to have the liquid repellent property, in the case the contact angle with respect to the liquid is small, due to the insufficient liquid repellent property, for example in the case of coating and curing a colored layer forming coating solution for forming the above-mentioned colored layer by the ink jet method or the like, the colored layer forming coating solution may be adhered also onto the liquid repellent region, a highly precise pattern can hardly be formed.

Moreover, it is preferable that the photocatalyst containing layer in the part with the energy radiation, that is, in the lyophilic region, is a layer having the contact angle with respect to a liquid having a 40 mN/m surface tension of less than 9°, preferably the contact angle with respect to a liquid having a 50 mN/m surface tension of 10° or less, and particularly preferably the contact angle with respect to a liquid having a 60 mN/m surface tension of 10° or less. In the case the contact angle with respect to a liquid in the part with the energy radiation, that is, in the lyophilic region is high, for example the colored layer forming coating solution for forming the colored layer can be repelled also in the lyophilic region. Therefore, for example, at the time of coating the colored layer forming coating solution by the ink jet method or the like, formation of the colored layer may be difficult since the colored layer forming coating solution does not sufficiently spread out.

In the invention, the difference in contact angle with respect to a liquid having a surface tension of 40 mN/m between the lyophilic region and the liquid repellent region is preferably 10° or more, more preferably from 20 to 60°. If the wettability difference between the lyophilic region and the liquid repellent region is small, at the time of applying the colored layer forming coating solution onto each of the pixels in a constant supply amount, so as to make the pixels into predetermined shapes, the colored layer forming coating solution cannot be kept only in the lyophilic region. As a result, it is difficult to form the colored layer having an even shape in the individual pixels.

The contact angle with respect to a liquid here is obtained from the results or a graph of the results of measuring (30 seconds after of dropping liquid droplets from a micro syringe) the contact angle with respect to liquids having various surface tensions using a contact angle measuring device (CA-Z type manufactured by Kyowa Interface Science, Co., Ltd.). Moreover, at the time of the measurement, as the liquids having the various surface tensions, wetting index standard solution manufactured by JUNSEI CHEMICAL CO., LTD. were used.

According to the photocatalyst containing layer used in the present invention, the photocatalyst containing layer may be formed such that a fluorine is contained in the photocatalyst containing layer. Furthermore, the photocatalyst containing layer may be formed such that the fluorine content of the photocatalyst containing layer surface is lowered at the time of radiating an energy to the photocatalyst containing layer according to the action of the photocatalyst compared with the state before the energy radiation. Moreover, it may be formed including a decomposing substance to be decomposed by the action of the photocatalyst accompanied by the energy radiation, and thereby changing the wettability on the photocatalyst containing layer.

Hereinafter, the photocatalyst, the organopolysiloxane, and the other components comprising such a photocatalyst containing layer will be explained.

a. Photocatalyst

First, the photocatalyst used in the present invention will be explained. As the photocatalyst used in the present invention, those known as photo semiconductors, such as a titanium dioxide ($TiO_2$), a zinc oxide (ZnO), a tin oxide ($SnO_2$), a strontium titanate ($SrTiO_3$), a tungsten oxide ($WO_3$), a bismuth oxide ($Bi_2O_3$), and an iron oxide ($Fe_2O_3$) can be presented, and one or two or more kinds as a mixture can be selected and used from them.

The effect mechanism of such a photocatalyst is unclear. However, it appears that radicals generated by radiation with light reacts directly with adjacent compounds or generates active species in the presence of oxygen or water, so as to change the chemical structure of an organic substance. In the invention, it appears that the radicals or active oxygen species act on the organopolysiloxane in the photocatalyst containing layer so that the wettability of the surface thereof is changed.

In the invention, in particular, a titanium dioxide can be used preferably since it has high band gap energy, it is chemically stable without the toxicity, and it can be obtained easily. There are anatase type and rutile type in the titanium dioxides, and either can be used in the present invention, however, the anatase type titanium dioxide is preferable. The anatase type titanium dioxide has a 380 nm or less excitation wavelength.

As the anatase type titanium dioxide, for example, a hydrochloric acid deflocculation type anatase type titania sol (STS-02 (average particle diameter 7 nm) manufactured by ISHIHARA SANGYO KAISHA, LTD., ST-K01 manufactured by ISHIHARA SANGYO KAISHA, LTD.), a nitric acid deflocculation type anatase type titaniasol (TA-15 (average particle diameter 12 nm) manufactured by Nissan Chemical Industries, Ltd.) can be presented.

With a smaller particle diameter of the photocatalyst, the photocatalyst reaction can be generated more effectively, and thus it is preferable. An average particle diameter of 50 nm or less is preferable, and use of a photocatalyst of 20 nm or less is particularly preferable.

The photocatalyst content in the photocatalyst containing layer used in the present invention can be set in a range of 5 to 60% by weight, preferably in a range of 20 to 40% by weight.

b. Organopolysiloxane

Next, the organopolysiloxane used in the present invention will be explained. The organopolysiloxane used in the present invention is not particularly limited as long as it can change the wettability of the photocatalyst containing layer surface by the action of the photocatalyst accompanied by the energy radiation. In particular, those having a high bond energy such that the principal skeleton is not decomposed by the photo excitation of the photocatalyst, and an organic substituent to be decomposed by the action of the photocatalyst are preferable. Specifically, (1) an organopolysiloxane to provide high strength by hydrolysis or polycondensation of such as a chloro or alkoxy silane by the sol gel reaction or the like, (2) an organopolysiloxane obtained by cross-linking a reactive silicone having the excellent water repellent property or the oil repellent property, or the like can be presented.

In the case (1), it is preferably an organopolysiloxane as a hydrolyzed condensation product or a co-hydrolyzed condensation product of one or two or more kinds of silicon compounds represented by the general formula:

$$Y_n SiX_{(4-n)}$$

(Here, Y is an alkyl group, a fluoroalkyl group, a vinyl group, an amino group, a phenyl group, a chloroalkyl group, an isocyanate group, an epoxy group or an organic group containing them; X is an alkoxyl group, an acetyl group or a halogen; and n is an integer from 0 to 3). Here, the alkoxy group represented by X is preferably a methoxy group, an ethoxy group, a propoxy group, or a butoxy group. Moreover, the number of atoms of the entire organic group represented by Y is preferably in a range of 1 to 20, in particular, in a range of 5 to 10.

Thereby, at the time of forming the photocatalyst containing layer, the surface can be provided with the liquid repellent property by the Y comprising the organopolysiloxane. Moreover, according to the action of the photocatalyst accompanied by the energy radiation, the lyophilic property can be provided by the decomposition of the Y, or the like.

Moreover, since the photocatalyst containing layer before the energy radiation can have the particularly high liquid repellent property in the case an organopolysiloxane having the Y comprising the organopolysiloxane as a fluoro alkyl group, it is preferable to use an organopolysiloxane having the fluoro alkyl group in the case such as a high liquid repellent property is required. As such an organopolysiloxane, specifically, a hydrolyzed condensation product or a co-hydrolyzed condensation product of one or two or more kinds of the below-mentioned fluoroalkyl silanes can be presented. Those generally known as a fluorine based silane coupling agent can be used.

$CF_3(CF_2)_3CH_2CH_2Si(OCH_3)_3$;
$CF_3(CF_2)_5CH_2CH_2Si(OCH_3)_3$;
$CF_3(CF_2)_7CH_2CH_2Si(OCH_3)_3$;
$CF_3(CF_2)_9CH_2CH_2Si(OCH_3)_3$;
$(CF_3)_2CF(CF_2)_4CH_2CH_2Si(OCH_3)_3$;
$(CF_3)_2CF(CF_2)_6CH_2CH_2Si(OCH_3)_3$;
$(CF_3)_2CF(CF_2)_8CH_2CH_2Si(OCH_3)_3$;
$CF_3(C_6H_4)C_2H_4Si(OCH_3)_3$;
$CF_3(CF_2)_3(C_6H_4)C_2H_4Si(OCH_3)_3$;
$CF_3(CF_2)_5(C_6H_4)C_2H_4Si(OCH_3)_3$;
$CF_3(CF_2)_7(C_6H_4)C_2H_4Si(OCH_3)_3$;
$CF_3(CF_2)_3CH_2CH_2SiCH_3(OCH_3)_2$;
$CF_3(CF_2)_5CH_2CH_2SiCH_3(OCH_3)_2$;

$CF_3(CF_2)_7CH_2CH_2SiCH_3(OCH_3)_2$;
$CF_3(CF_2)_9CH_2CH_2SiCH_3(OCH_3)_2$;
$(CF_3)_2CF(CF_2)_4CH_2CH_2SiCH_3(OCH_3)_2$;
$(CF_3)_2CF(CF_2)_6CH_2CH_2SiCH_3(OCH_3)_2$;
$(CF_3)_2CF(CF_2)_8CH_2CH_2SiCH_3(OCH_3)_2$;
$CF_3(C_6H_4)C_2H_4SiCH_3(OCH_3)_2$;
$CF_3(CF_2)_3(C_6H_4)C_2H_4SiCH_3(OCH_3)_2$;
$CF_3(CF_2)_5(C_6H_4)C_2H_4SiCH_3(OCH_3)_2$;
$CF_3(CF_2)_7(C_6H_4)C_2H_4SiCH_3(OCH_3)_2$;
$CF_3(CF_2)_3CH_2CH_2Si(OCH_2CH_3)_3$;
$CF_3(CF_2)SCH_2CH_2Si(OCH_2CH_3)_3$;
$CF_3(CF_2)_7CH_2CH_2Si(OCH_2CH_3)_3$;
$CF_3(CF_2)_9CH_2CH_2Si(OCH_2CH_3)_3$;
$CF_3(CF_2)_7SO_2N(C_2H_5)C_2H_4CH_2Si(OCH_3)_3$.

Moreover, as the reactive silicone (2), compounds having a skeleton represented by the following general formula can be presented.

Here, n is an integer of 2 or more, $R^1$, $R^2$ each are a substituted or nonsubstituted alkyl, alkenyl, aryl or cyanoalkyl group having 1 to 10 carbon atoms, and 40% or less of the entirety based on the mole ratio is a vinyl, a phenyl, or a halogenated phenyl. Moreover, those having $R^1$, $R^2$ as a methyl group are preferable since the surface energy becomes smallest, and it is preferable that a methyl group accounts for 60% or more based on the mole ratio. Moreover, at least one reactive group such as a hydroxyl group is provided in a molecular chain at the chain end or the side chain.

It is preferable that the organopolysiloxane is contained in the photocatalyst containing layer from 5% by weight to 90% by weight, in particular, about from 30% by weight to 60% by weight.

c. Other Substances

To the photocatalyst containing layer used in the present invention, together with the organopolysiloxane, a stable organosilicon compound not to have the cross-linking reaction such as a dimethylpolysiloxane may be mixed to a binder. Furthermore, as a binder, a polysiloxane having a principal skeleton with a high bond energy not to be decomposed by the photo excitation of the photocatalyst, not having an organic substituent, or having an organic substituent can be presented. Specifically, a hydrolysis or polycondensation product of a tetramethoxysilane, a tetraethoxysilane or the like may be contained.

Furthermore, in order to aid the function of changing the wettability of the organopolysiloxane, or the like, a decomposable substance to be decomposed by the energy radiation may be contained. As such a decomposable substance, a surfactant to be decomposed by the action of the photocatalyst, having the function of changing the wettability of the photocatalyst containing layer surface according to the decomposition can be presented. Specifically, hydrocarbons of the respective series of NIKKO L BL, BC, BO, and BB manufactured by Nikko Chemicals Co., Ltd., and fluorine base or silicone base nonionic surfactants such as ZONYL FSN and FSO manufacture by Du Pont Kabushiki Kaisha, Surflon S-141 and 145 manufactured by ASAHI GLASSCO., LTD., Megaface F-141 and 144 manufactured by DAINIPPON INK AND CHEMICALS, Inc., FTERGENT F-200 and F251 manufactured by NEOS, UNIDYNEDS-401 and 402 manufactured by DAIKIN INDUSTRIES, Ltd., and Fluorad FC-170 and 176 manufactured by 3M can be cited, and cationic surfactants, anionic surfactants and amphoteric surfactants also can be used.

Other than the surfactants, oligomers and polymers such as a polyvinyl alcohol, an unsaturated polyester, an acrylic resin, a polyethylene, a diallyl phthalate, an ethylene propylene diene monomer, an epoxy resin, a phenol resin, a polyurethane, a melamine resin, a polycarbonate, a polyvinyl chloride, a polyamide, a polyimide, a styrene-butadiene rubber, a chloroprene rubber, a polypropylene, a polybutylene, a polystyrene, a polyvinyl acetate, a nylon, a polyester, a polybutadiene, a polybenzimidazole, a polyacrylonitrile, an epichlorohydrine, a polysulfide, and a polyisoprene can be cited.

d. Containment of the Fluorine

Moreover, according to the present invention, it is preferable that the photocatalyst containing layer contains a fluorine, and furthermore, the photocatalyst containing layer is formed so as to have the fluorine content of the photocatalyst containing layer surface is lowered with respect to the state before the energy radiation by the action of the photocatalyst at the time an energy is radiated to the photocatalyst containing layer. Thereby, according to the pattern radiation of the energy, as it will be described later, a pattern having a part with a small fluorine content can be formed easily. Here, since the fluorine has an extremely low surface energy, the surface of a substance containing a large amount of a fluorine has a smaller critical surface tension. Therefore, the critical surface tension of a part with a small fluorine content is larger than the critical surface tension of the surface of a substance with a large fluorine content. That is, it denotes that the part with a small fluorine content becomes a lyophilic region compared with the part with a large fluorine content. Therefore, by forming a pattern comprising a part with a small fluorine content compared with the surface of the periphery, a pattern of a lyophilic region is formed in a liquid repellent region.

Accordingly, when such a photocatalyst containing layer is used, energy is radiated thereto into a pattern form, whereby a pattern of a lyophilic region can easily be formed inside a liquid repellent region. Accordingly, by use of, for example, an ink jet method, the colored layer forming coating solution can be applied in an optimal supply amount to each of the colored layer. Thus, colored layer having an even shape as explained above can be formed.

As to the fluorine content in the photocatalyst containing layer containing a fluorine as mentioned above, the fluorine content in the lyophilic region having a low fluorine content formed by the energy radiation is 10 or less based on the fluorine content in the area without the energy radiation as 100, it is preferably 5 or less, and it is particularly preferably 1 or less.

According to the range, a large difference can be generated in terms of the lyophilic property in the energy radiated part and the unradiated part. Therefore, by adhering for example a colored layer forming coating solution to such a photocatalyst containing layer, the colored layer can be formed accurately only in the lyophilic region with the fluorine content lowered so that a color filter good in precision can be obtained. The lowering ratio is based on the weight.

As to the measurement of the fluorine content in the photocatalyst containing layer, various methods commonly executed can be used, and it is not particularly limited as long as it is a method capable of measuring the fluorine amount quantitatively on the surface such as the X-ray Photoelectron Spectroscopy, the ESCA (it is also referred to as the Electron Spectroscopy for Chemical Analysis), the fluorescent X ray analysis method, and the mass spectrometry.

Moreover, according to the present invention, a titanium dioxide can be used preferably as the photocatalyst as mentioned above. As the fluorine content in the photocatalyst containing layer in the case of using the titanium dioxide, it is preferable that the fluorine (F) element is contained in the photocatalyst containing layer surface by the ratio with the fluorine (F) element of 500 or more, preferably 800 or more, and particularly preferably 1,200 or more with the premise that the titanium (Ti) element is 100 according to the analysis and quantification by the X-ray Photoelectron Spectroscopy.

Since the fluorine (F) is contained in the photocatalyst containing layer to this extent, the critical surface tension on the photocatalyst containing layer can be made sufficiently low so that the liquid repellent property in the surface can be ensured. Thereby, the wettability difference of the pattern part with the fluorine content reduced by the energy pattern radiation with respect to the surface lyophilic region can be made larger so that the precision of the color filter to be obtained finally can be improved.

Furthermore, according to such a color filter, as to the fluorine content in the lyophilic region formed by the energy pattern radiation, it is preferable that the fluorine (F) element is contained by the ratio of 50 or less, preferably 20 or less, and particularly preferably 10 or less with the premise that the titanium (Ti) element is 100.

In the case the fluorine content in the photocatalyst containing layer is reduced to this extent, a lyophilic property sufficient for forming a color filter can be obtained so that the color filter can be formed precisely according to the liquid repellent property and the wettability difference with respect to the part with the energy not radiated, and thus a color filter having the high utilization value can be obtained.

e. Method for Forming a Photocatalyst Containing Layer

Figure 2:
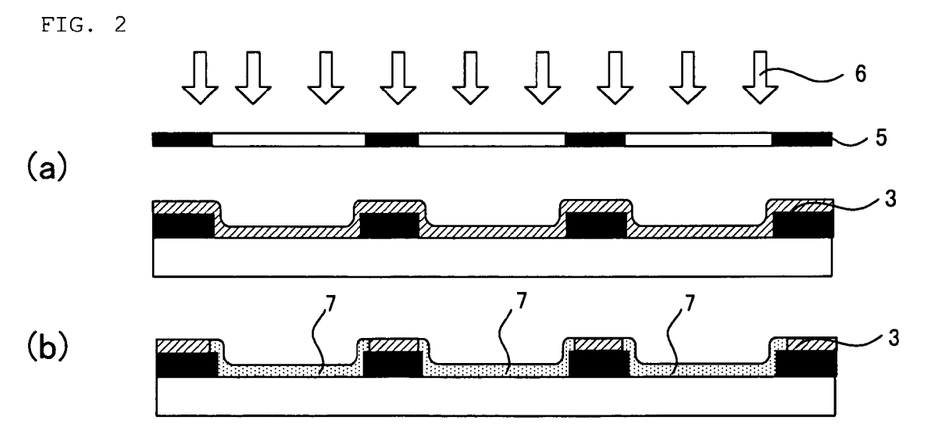
FIGS. 2A and 2B are each an explanatory view illustrating the step of changing the wettability of a photocatalyst containing layer used in the invention.

As to the method for forming the photocatalyst containing layer mentioned above, it can be formed by dispersing the photocatalyst and organopolysiloxane in a solvent as needed with the other additives so as to prepare a coating solution, and coating the coating solution on to a base material. As the solvent to be used, alcohol based organic solvents such as an ethanol and an isopropanol are preferable. The coating operation can be carried out by a known coating method such as spin coating, spray coating, dip coating, roll coating and bead coating. In the case an ultraviolet ray curing type component is contained as a binder, the photocatalyst containing layer can be formed with an execution of a curing process by irradiating an ultraviolet ray. At the time, the thickness of the photocatalyst containing layer is preferably in a range of 0.05 to 10 μm. In the case it is thinner than the ratio, the function such as the wettability change of the surface of the photocatalyst containing layer can be made lower, and thus it is not preferable. Moreover in the case it is thicker than the range, since the distance between the light shielding part to be described later and the colored layer is long, when the color filter is used for a liquid crystal display, problems such as the light leakage of the back light can be generated, and thus it is not preferable.

f. Method for Forming a Wettability Changed Pattern on the Photocatalyst Containing Layer Next, the method for forming a wettability changed pattern with the wettability changed by the pattern for forming the colored layer to be described later with the energy radiation to the photocatalyst containing layer will be explained. According to the present invention, as mentioned above, the organopolysiloxane in the photocatalyst containing layer has the wettability change by the action of the photocatalyst accompanied by the energy radiation. Therefore, for example, as shown in FIGS. 2A and 2B, by radiating the energy 6 to the photocatalyst containing layer 3 via such as a photo mask 5 (FIG. 2A), the wettability changed pattern 7 with the wettability changed can be formed on the photocatalyst containing layer 3 (FIG. 2B). By forming the wettability changed pattern on the photocatalyst containing layer, at the time of coating the colored layer forming coating solution for forming the colored layer to be described later by the ink jet method or the like, the colored layer forming coating solution can be adhered only on the wettability changed pattern 7 with the wettability changed without the ink adhesion onto the area with no energy radiated so that the colored layer forming coating solution can be adhered highly precisely. Thereby the colored layer with the above-mentioned shape can be formed.

Here, as the energy to be radiated to the photocatalyst containing layer, the method is not particularly limited as long as it is a method for radiating an energy capable of changing the wettability of the photocatalyst containing layer. The energy radiation (exposure) in the present invention is the concept including any radiation of the energy line capable of changing the wettability of the photocatalyst containing layer surface, and thus it is not limited to the visible light radiation.

The light wavelength of the light generally used for the energy radiation can be set in a range of 400 nm or less, preferably in a range of 150 nm to 380 nm. This is because the preferable photocatalyst used for the photocatalyst containing layer is a titanium dioxide as mentioned above, and a light having the above-mentioned wavelength is preferable as the energy for activating the photocatalyst action by the titanium dioxide.

As a light source to be used for the energy radiation, a mercury lamp, a metal halide lamp, a xenon lamp, an excimer lamp, and various other light sources can be presented. Moreover, in addition to the method of executing the pattern radiation via a photo mask using the light source mentioned above, a method of drawing radiation in a pattern using a laser such as an excimer or a YAG can be used as well.

The energy radiation amount at the time of the energy radiation is defined to be the radiation amount necessary for changing the wettability of the photocatalyst containing layer surface by the action of the photocatalyst in the photocatalyst containing layer.

At the time, by irradiating the energy while heating the photocatalyst containing layer, the sensitivity can be further raised so that the wettability can be changed efficiently, and thus it is preferable in this regard. Specifically, it is preferable to heat in a range of 30° C. to 80° C.

About the direction of the energy radiation in the invention is as follows: in the case that the base material which will be detailed later is transparent, pattern energy radiation through a photomask or a laser drawing radiation maybe performed from any one of the side of the base material and the side of the photocatalyst containing layer. In the invention, it is preferable that the wettability of the photocatalyst containing layer formed on end portions of the light shielding part is changed; in this case, therefore, it is preferable that scattered light is used as the above-mentioned energy. This makes it possible that, even if the energy is radiated to the entire surface from the side of the base material, the wettability of the photocatalyst containing layer formed on the opening portions of the light shielding part and the end portions of the light shielding part is changed. Accordingly, the invention has an advantage that the above-mentioned wettability changed pattern can be effectively formed without using the step of positioning a photo mask and so forth or other steps. In the meantime, in the case that the base material is not transparent, it is necessary that the energy is radiated from the side of the photocatalyst containing layer.

3. Light Shielding Part

Next, the light shielding part used in the invention will be explained. The light shielding part is not particularly limited as long as the part is a part which is formed on the base material that will be detailed later, which contains a light shielding material and a resin, which shields the radiated energy in the color filter of the invention, and which can be formed into a predetermined thickness. The method used for forming the light shielding part is appropriately selected in accordance with the shielding property against the required energy, or other factors.

Usually, the film thickness of the light shielding part is preferably from 1.0 to 1.5 µm, more preferably from 1.0 to 1.4 µm, even more preferably from 1.0 to 1.2 µm. Usually, the film thickness of each of the minimum film thickness portions is decided by the film thickness of the light shielding part; therefore, when the film thickness of the light shielding part is set into the above-mentioned range, the ratio between the average of the film thicknesses of the maximum film thickness portions and that of the film thicknesses of the minimum film thickness portions can be set into the above-mentioned range.

As the method for forming the resin light shielding part in the present invention, for example, a method of forming a layer containing carbon fine particles, light shielding particles such as of a metal oxide, an inorganic pigment, an organic pigment in a resin binder in to a pattern, or the like can be used. As the resin binder to be used, one kind or a mixture of two or more kinds of resins such as a polyimide resin, an acrylic resin, an epoxy resin, a polyacrylicamide, a polyvinyl alcohol, a gelatin, a casein, and a cellulose, a photosensitive resin, an O/W emulsion type resin composition such as an emulsion of a reactive silicone can be used. As the patterning method for the resin light shielding part, a commonly used method such as a photolithography method or a printing method can be used.

Moreover, in the present invention, the light shielding part may be formed by the thermal transfer method. According to the thermal transfer method for forming the light shielding part in general, a light shielding part is formed by disposing on a base material a thermal transfer sheet with a photo thermal conversion layer and a light shielding part transfer layer provided on one side of a transparent film base material, and radiating an energy to the area for forming the light shielding part so as to transfer the light shielding part transfer layer onto the base material.

The light shielding part to be transferred by the thermal transfer method in general comprises a light shielding material and a binding agent. As the light shielding material, inorganic particles of such as a carbon black or a titanium black can be used. The particle size of the light shielding material is preferably in a range of 0.01 to 1.0 µm, in particular, in a range of 0.03 to 0.3 µm.

Moreover, as to the binding agent, it is preferable that it has a resin composition having the thermoplastic property and the thermosetting property, and it is preferable that it has a thermosetting functional group, a resin material having a softening point in a range of 50° C. to 150° C., in particular, 60° C. to 120° C., and a hardening agent, or the like. As such a material, specifically, an epoxy compound having two or more epoxy groups in one molecule, a combination of an epoxy resin and a potential hardening agent thereof, or the like can be presented. Moreover, as the potential hardening agent for an epoxy resin, a hardening agent not showing the reactivity with an epoxy group up to a certain temperature and having the molecular structure change to show the reactivity with the epoxy group at the time it reaches at the activating temperature by heating can be used. Specifically, a neutral salt or complex of an acidic or basic compound having the reactivity with an epoxy resin, a block compound, a high melting point substance, and a micro capsule contained substance can be presented. Moreover, in the light shielding part, in addition to the materials, a mold releasing agent, a bonding auxiliary agent, an antioxidant, a dispersing agent, or the like may be contained.

Here, according to the present invention, a primer layer may be formed between the photocatalyst containing layer and the light shielding part. Although the effect and the function of the primer layer is not always clear, it is considered that by forming the primer layer, the primer layer provides the function of preventing diffusion of the impurities from the opening portion existing in the light shielding part or between the light shielding parts, in particular, impurities such as residues generated when the light shielding part is patterned, to be the factor of inhibiting the wettability change of the photocatalyst containing layer. Therefore, by forming the primer layer, the wettability of the photocatalyst containing layer can be changed with a high sensitivity, and as a result, a pattern with a high resolution can be obtained.

In the present invention, since the primer layer is for preventing the influence on the photocatalyst effect by the impurities existing not only on the light shielding part but also in the opening portion formed between the light shielding parts, it is preferable that the primer layer is formed on the entire surface of the light shielding part including the opening portion.

The primer layer in the present invention is not particularly limited as long as it has a structure with the primer layer formed without having the light shielding part and the photocatalyst containing layer contacted.

The material for providing the primer layer is not particularly limited, but an inorganic material to be hardly decomposed by the action of the photocatalyst is preferable. Specifically, an amorphous silica can be presented. In the case of using the amorphous silica, the precursor of the amorphous silica is represented by the general formula: $SiX_4$. X is preferably a silicon compound such as a halogen, a methoxy group, an ethoxy group or an acetyl group, a silanol as a hydrolysis product thereof, or a polysiloxane having a 3,000 or less average molecular weight.

Moreover, the film thickness of the primer layer is preferably in a range of 0.001 to 1 µm, and particularly preferably in a range of 0.001 to 0.1 µm.

4. Base Material

Next, the base material used in the present invention will be explained. The base material used in the present invention is not particularly limited as long as the light shielding part and photocatalyst containing layer can be formed, and thus those conventionally used for color filters can be used. Specifically, a transparent rigid material without flexibility, such as a quartz glass, a pyrex (registered trademark) glass, and a synthetic quartz plate, and a transparent flexible material having flexibility, such as a transparent resin film and an optical resin plate can be presented. Among these, since the 7059 glass manufactured by Corning Inc. is a material having a small thermal expansion coefficient having the excellent dimensional stability and the operability in a high temperature heating process, and furthermore, it is a no-alkaline glass not containing an alkaline component in the glass, it is suitable for a color filter for color liquid crystal display driven by an active matrix system. In the present invention, a transparent base material is used in general, but a reflective substrate and a substrate colored in white can be used as well. Moreover, the base material as needed with the surface process such as for preventing the alkaline elution and providing the gas barrier property applied can be used.

5. Color Filter

The color filter of the invention is not particularly limited as long as the color filter is a color filter having the base material, the light shielding part formed on the base material, the photocatalyst containing layer formed so as to cover the base material and the light shielding part, and the colored layer formed on the photocatalyst containing layer and having the above-mentioned shape. Besides, for example, a protecting layer, an ITO layer, or any other layer may be formed therein.

B. Method for Producing the Color Filter

Next, a method for producing the above-mentioned color filter is explained. The color filter can be formed by performing the following steps:

a light shielding part forming step of forming a light shielding part containing a light shielding material and a resin so as to have a film thickness within a predetermined range on a base material;

a photocatalyst containing layer forming step of forming a photocatalyst containing layer which contains a photocatalyst and an organopolysiloxane so as to cover the base material and the light shielding part;

a wettability changed pattern forming step of radiating energy to the photocatalyst containing layer along a predetermined direction, thereby forming a wettability changed pattern having a decreased contact angle with respect to a liquid on the surface of the photocatalyst containing layer; and a colored layer forming step of applying a colored layer forming coating solution onto the wettability changed pattern, in a constant supply amount for each of pieces of the pattern, by an ink jet method or the like, and then drying the colored layer forming coating solution under predetermined conditions, thereby forming a colored layer.

Figure 3:
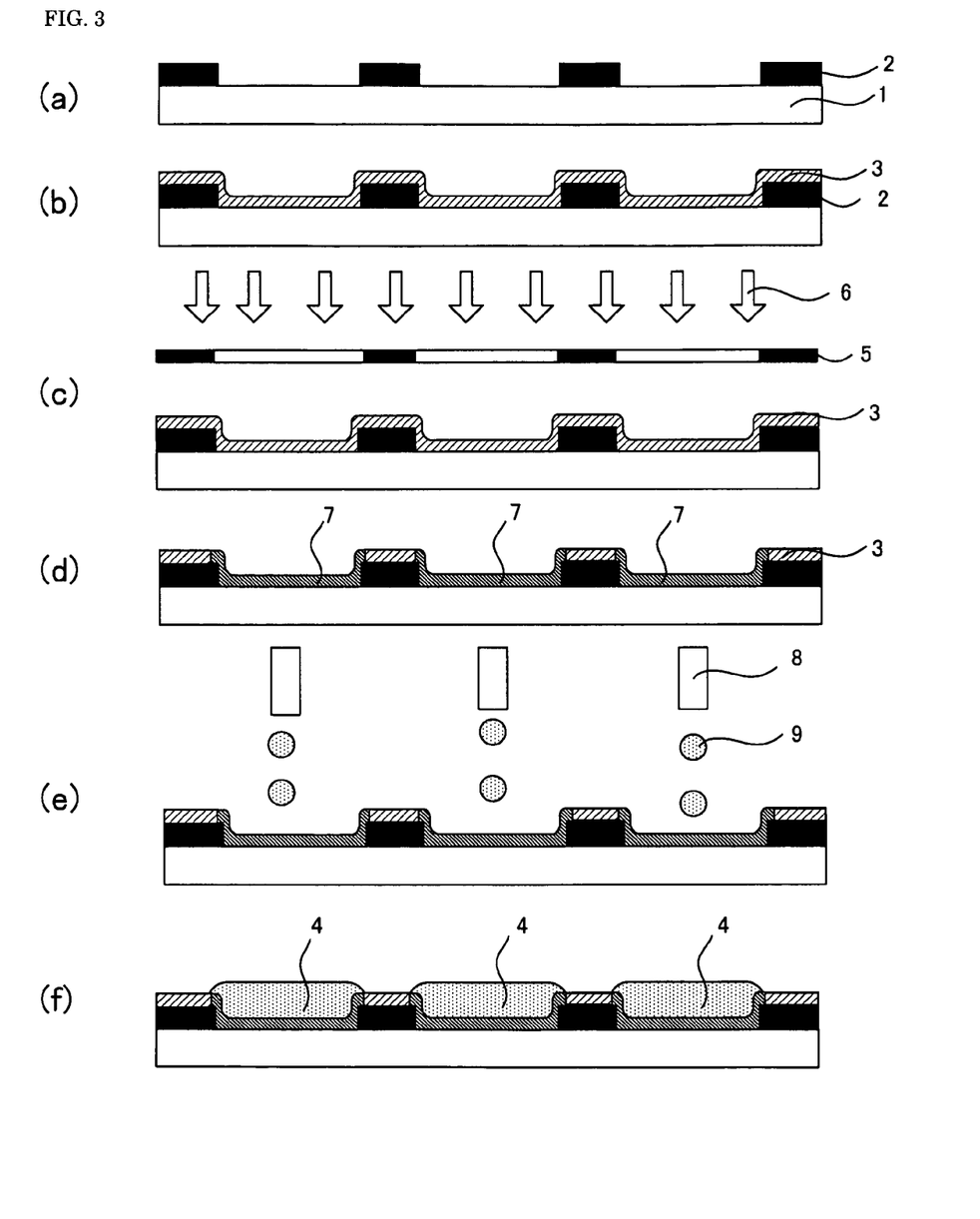
FIGS. 3A to 3F are each an explanatory view illustrating an example of a method for producing the color filter of the invention.

As illustrated in FIGS. 3A to 3F as examples, the method for producing the color filter of the invention, the following steps are performed: a light shielding part forming step of forming a light shielding part 2 having a predetermined film thickness on a base material 1 (FIG. 3A); and a photocatalyst layer forming step of forming a photocatalyst layer 3 so as to cover the base material 1 on which the light shielding part 2 is formed (FIG. 3B).

Next, performed are a wettability changed pattern forming step of radiating energy 6, through such as a photo mask 5, onto this photocatalyst containing layer 3 from a predetermined direction (FIG. 3C), thereby forming a wettability changed pattern 7 wherein the wettability of the surface of the photocatalyst containing layer 3 is changed (FIG. 3D); and subsequently a colored layer forming step of applying a colored layer forming coating solution 9 onto this wettability changed pattern 7 by means of an ink jet device 8 or the like, and drying the applied coating solution under predetermined drying conditions and so forth (FIG. 3E), thereby forming a colored layer 4 (FIG. 3F).

According to the invention, the wettability changed pattern forming step, wherein energy is radiated to the photocatalyst containing layer to form a wettability changed pattern, is performed; therefore, in the colored layer forming step, by an ink jet method, a colored layer forming coating solution can be applied to each of pieces of the pattern in a constant supply amount. In the case of adjusting regions where the pieces of the wettability changed pattern are formed at this time, the shapes of individual pixels in the color filter can be made even. Thus, a high-quality color filter capable of attaining even color display when the filter is used in a liquid crystal display can be produced.

The following will explain each of the steps in detail.

1. Light Shielding Part Forming Step

First, the light shielding part forming step in the invention is explained. The light shielding part forming step is a step of forming a light shielding part containing a light shielding material and a resin into a predetermined film thickness on a base material.

The film thickness of the light shielding part formed in the invention is usually from 1.0 to 1.5 μm, preferably from 1.0 to 1.4 μm, more preferably from 1.0 to 1.2 μm. This makes it possible to set the ratio between the average of the film thicknesses of the maximum film thickness portions and that of the film thicknesses of the minimum film thickness portions into the predetermined range.

The method for forming the light shielding part in the present step is not particularly limited as long as the method is capable of forming the light shielding part as explained above. Examples of the method include a method of forming a layer wherein light shielding particles made of carbon fine particles, a metal oxide, an inorganic pigment or an organic pigment are incorporated into a resin binder into a pattern form by photolithography method, printing method or the like; and a thermally transferring method. The material used in the light shielding part, and others can be rendered the same as explained in the item of the light shielding part in the above-mentioned "A. Color filter". Thus, detailed description thereof is not repeated herein.

2. Photocatalyst Containing Layer Forming Step

Next, the photocatalyst containing layer forming step in the invention is explained. The photocatalyst containing layer forming step is not particularly limited as long as the step is a step of forming a photocatalyst containing layer, which contains a photocatalyst and an organopolysiloxane, to cover the above-mentioned base material and light shielding part. In the present step, the photocatalyst containing layer can be formed by dispersing the photocatalyst and the organopolysiloxane explained in the item "A. Color filter", optionally together with other additives, into a solvent to prepare a coating solution, and then applying this coating solution onto the base material. The application of the coating solution can be attained by a known coating method such as spin coating, spray coating, dip coating, roll coating or bead coating. In the case that the coating solution contains an ultraviolet curable component as a binder, the coating solution is radiated with ultraviolet rays to be cured, whereby the photocatalyst containing layer can be formed. At this time, it is preferable to set the thickness of the photocatalyst containing layer into the range of 0.05 to 10 μm.

3. Wettability Changed Pattern Forming Step

Next, the wettability changed pattern forming step in the invention is explained. The wettability changed pattern forming step is a step of radiating energy onto the photocatalyst containing layer formed in the photocatalyst containing layer forming step from a predetermined direction, thereby forming a wettability changed pattern wherein the contact angle to a liquid on the surface of the photocatalyst containing layer is lowered. In the present step, the wettability changed pattern, wherein the wettability of the photocatalyst containing layer is changed in the form of a pattern for forming a colored layer, is formed, thereby making it possible to form the colored layer in consistency with this wettability changed pattern in the colored layer forming step which will be detailed later. Thus, the colored layer can be made into a highly precise pattern. In the invention, the colored layer forming coating solution is applied in consistency with this wettability changed pattern. Therefore, the applied colored layer forming coating solution neither wets nor spreads to any other region than the wettability changed pattern. Thus, in the colored layer forming step, which will be detailed later, the colored layer forming coating solution can be applied, into an even shape and a predetermined supply amount, to individual pieces of the patterns.

It is preferable that at this time the wettability changed pattern is formed to cover the opening portions in the light shielding part and some portions of the light shielding part. Specifically, it is preferable that energy is radiated to regions extending from end portions of the light shielding part to the inside of the light shielding part by about 5 to 30 µm, preferably by about 10 to 20 µm, thereby forming the wettability changed pattern. This makes it possible to form the colored layer to cover the end portions of the light shielding part. Accordingly, the film thickness of the colored layer can be prevented from becoming small in the vicinity of boundaries between the light shielding part and the opening portions, so that the difference between the maximum film thickness portions and the minimum film thickness portions can be set into the above-mentioned range.

In the invention, it is preferable that the difference between the contact angle of the wettability changed pattern, wherein the wettability is changed, with respect to a liquid having a surface tension of 40 mN/m and that of the regions radiated with no energy, wherein the wettability is not changed, with respect to the liquid is preferably 10° or more, more preferably within the range of 20° to 60°. This makes it possible to apply the colored layer forming coating solution to each of pixels into a predetermined constant supply amount in the colored layer forming step, which will be detailed later, so that colored layer each having a target shape is formed.

The method for the energy radiation in the present step may be the same as explained in the item of the photocatalyst containing layer of the above-mentioned "A. Color filter". Thus, detailed description thereof is not repeated here.

4. Colored Layer Forming Step

Next, the colored layer forming step in the invention is explained. The colored layer forming step is a step of: applying the colored layer forming coating solution, in a constant supply amount, onto each pattern piece of the wettability changed pattern formed in the wettability changed pattern forming step, with respect to a predetermined area of the photocatalyst containing layer, by an ink jet method or the like; and then drying the colored layer forming coating solution under predetermined drying conditions to form a colored layer. In the invention, the wettability changed pattern is formed in the wettability changed pattern forming step; accordingly, in the case of applying the colored layer forming coating solution onto the wettability changed pattern in a constant supply amount for each of pixels, the individual pixels can have an even shape.

Specifically, the supply amount of the colored layer forming coating solution is preferably from 10 to 100 fL (femtoliter), more preferably from 20 to 50 fL per square micrometer of the photocatalyst containing layer. This makes it possible to set the film thickness of the formed colored layer usually into the range of 1.5 to 3 µm, in particular, into the range of about 1.7 to 2.8 µm. As a result, the ratio between the average of the film thicknesses of the maximum film thickness portions and that of the film thicknesses of the minimum film thickness portions can be set into the above-mentioned range.

The colored layer forming coating solution used in the present step may be a colored layer forming coating solution used when a colored layer of ordinary color filters is formed, and is in particular preferably a colored layer coating solution wherein the concentration of solid contents is from about 15 to 30% by weight, preferably about 20% by weight, and the ratio by weight of any pigment (P) to any binder (V) (P/V) is from about 0.2 to 0.4, preferably about 0.3. This makes it possible that the above-mentioned supply amount gives the above-mentioned film thickness and further the colored layer is made good in color development.

In the present step, an ink jet device used in the application of the colored layer forming coating solution is not particularly limited. Examples thereof include ink jet devices using various methods such as a method of jetting the charged colored layer forming coating solution which is electrically charged continuously and controlling the solution by a magnetic field, a method of jetting the colored layer forming coating solution intermittently by use of a piezoelectric element, and a method of heating the colored layer forming coating solution to generate bubbles, and using the bubbles to jet the coating solution intermittently.

Subsequently, the colored layer forming coating solution applied by the above-mentioned method is dried under predetermined drying conditions, so as to be cured, thereby forming a colored layer having an evener shape in individual pixels. The method for the drying is appropriately selected in accordance with the kind of the colored layer forming coating solution, and others. An example thereof is a method of applying the same solvent as explained above in the vicinities of the colored layer in regions near the outside of the color filter, thereby adjusting the volatilization rate of the solvent in the individual regions.

Other examples thereof include a method of arranging partitions in the vicinities of the colored layer in regions near the outside of the color filter to prevent the solvent from volatilizing outwards, thereby adjusting the volatilization rate of the solvent; a method of sending air from the outside to the inside of the color filter at the time of the drying, thereby making the shapes of the colored layer in the individual pixels even; and a method wherein any two or more from these methods are combined.

The present invention is not limited to the embodiments. The embodiments are merely examples, and any one having the substantially same configuration as the technological idea disclosed in the claims of the present invention and the same effects is included in the technological scope of the present invention.

EXAMPLES

The invention will be more specifically explained by way of an example and a comparative example.

Example 1

1. Formation of the Light Shielding Part

A mixture of the below-mentioned composition was dissolved by heating at 90° C. and carrying out the centrifugal separation at 12,000 rpm, and then it was filtrated with a 1 µm glass filter. By adding 1% by weight of an ammonium dichromate as a cross linking agent to the obtained solution, a light shielding part forming coating solution for was prepared.

| | |
|---|---|
| Carbon black (produced by Mitsubishi Chemical Corporation #950) | 4 parts by weight |
| Polyvinyl alcohol (produced by Nippon Synthetic Chemical Industry Co., Ltd., GOHSENOL AH-26) | 0.7 part by weight |
| Ion exchange water | 95.3 parts by weight |

A light shielding part pattern (resist pattern) was formed as below using the obtained light shielding part forming coating solution for the evaluation. First, the above-mentioned light shielding part forming coating solution was coated onto a sodium glass transparent base material with a spin coater and dried by a hot plate at 80° C. for 1 minute. The film thickness after the drying operation measured by a stylus film thickness meter (α-step, produced by KLA-Tencor Corporation) was 1 μm. Next, the resist was imagewise radiated, into the form of a light shielding part pattern, with light from a mercury lamp through a photo mask. Subsequently, it was soaked in a developing agent containing 0.05% concentration of a potassium hydroxide and 0.1% concentration of a nonionic surfactant (EMULGEN A-60 produced by KAO CORPORATION) at 25° C. for development so as to obtain a light shielding pattern. Thereafter, by carrying out a heating treatment at 60° C. for 30 minutes, the light shielding part was formed to obtain a substrate for forming a color filter. The light shielding part was formed into a pattern having lines and spaces wherein the width of the light shielding part was 20 μm and the width of opening portions was 80 μm.

2. Formation of a Photocatalyst Containing Layer

An ST-K03 (manufactured by ISHIHARA SANGYO KAISHA, Ltd.), which is a photocatalyst inorganic coating agent, was diluted by 10 times with isopropanol to prepare a photocatalyst containing layer composition. This photocatalyst containing layer composition was applied onto the glass substrate on which the light shielding part was formed with a spin coater. The resultant was dried at 150° C. for 10 minutes to form a transparent photocatalyst containing layer (film thickness: 0.15 μm). Next, the resultant was radiated, from its rear face, with light from a super high pressure mercury lamp (illuminance: 30 mW/cm$^2$, 365 nm) In this way, the photocatalyst containing layer formed on the opening portions and the individual end portions (the regions extending from the ends to the insides by 2 μm) was made lyophilic.

3. Formation of a Colored Layer

A piezoelectrically-driving ink jet device was used to jet a red thermosetting colored layer forming coating solution (viscosity: 5 cp, 40 fL/μm$^2$) to the opening portions. As a result, the thermosetting colored layer forming coating solution spread over the whole of the opening portions, so that the solution wetted and spread not only to the opening portions but also to regions extending from the end portions of the light shielding part to the insides of the part by 2 μm. The viscosity was a value obtained when the coating solution was measured at 20° C. with a viscometer, VIBRO VISCOMETER CJV5000 (manufactured by A & D Co., LTD). Thereafter, the resultant was subjected to heating treatment, thereby forming a red colored layer. The colored layer wetted and spread evenly to the opening portions and individual end portions of the light shielding part. Subsequently, in the same way, blue and green colored layers were formed to produce a color filter. At this time, regarding ten pixels out of its pixels, the film thickness in the minimum film thickness portion, wherein the film thickness from the base material surface to the colored layer surface was minimum, and the film thickness in the maximum film thickness portion, wherein the film thickness from the base material surface to the colored layer surface was maximum, were measured in each pixel with a stylus film thickness meter (α-step, manufactured by KLA-Tencor Corporation). In the ten pixels, the average A of the film thicknesses of the maximum film thickness portions was 2.5 μm, and the average B of the film thicknesses of the minimum film thickness portions was 2.3 μm. The ratio α between the average A of the film thicknesses of the maximum film thickness portions and that B of the film thicknesses of the minimum film thickness portions (=B/A) was 0.9.

In this color filter, an even color display was able to be attained in the whole of the color filter.

Comparative Example

A color filter was produced in the same way as in Example except that: the photocatalyst layer was radiated, from its rear face, with parallel light made of a combination of a super high pressure mercury lamp with concave and convex lenses, so as to make only the photocatalyst containing layer formed on the opening portions divided by the light shielding part lyophilic; and at the time of curing the colored layer forming coating solution, ordinary heating treatment was conducted. At this time, regarding ten pixels out of its pixels, the film thickness in the minimum film thickness portion, wherein the film thickness from the base material surface to the colored layer surface was minimum, and the film thickness in the maximum film thickness portion, wherein the film thickness from the base material surface to the colored layer surface was maximum, were measured in each pixel with a stylus film thickness meter (α-step, manufactured by KLA-Tencor Corporation). In the ten pixels, the average A of the film thicknesses of the maximum film thickness portions was 2.4 μm, and that B of the film thicknesses of the minimum film thickness portions was 1.0 μm. The ratio α between the average A of the film thicknesses of the maximum film thickness portions and that B of the film thicknesses of the minimum film thickness portions (=B/A) was 0.42.

In this color filter, the color in the central portion thereof and the color in the peripheral portion thereof were uneven.

What is claimed is:

1. A method for producing a color filter comprising:
 a light shielding part forming step of forming a light shielding part containing a light shielding material and a resin so as to have a film thickness within a predetermined range on a base material;
 a photocatalyst containing layer forming step of forming a photocatalyst containing layer which contains a photocatalyst and an organopolysiloxane so as to cover the base material and the light shielding part;
 a wettability changed pattern forming step of radiating energy to the photocatalyst containing layer along a predetermined direction, thereby forming a wettability changed pattern having a decreased contact angle with respect to a liquid on the surface of the photocatalyst containing layer; and
 a colored layer forming step of applying a colored layer forming coating solution onto the wettability changed pattern, in a consistent supply amount for each of pieces of the pattern, by an ink jet method, and then drying the colored layer forming coating solution while adjusting the volatilization rate of a solvent included in the colored layer forming coating solution, by arranging partitions in the vicinities of the colored layer in regions near the outside of the color filter to prevent the solvent from volatilizing outwards, so as to obtain a colored layer having a more even shape, thereby forming a colored layer.

2. The method for producing a color filter according to claim 1, wherein the colored layer forming coating solution is dried in the colored layer forming step as follows:

regarding ten pixels out of its pixels, a film thickness of a maximum film thickness portion where a film thickness from a surface of the base material to a surface of the colored layer in the opening portion is maximum, and a film thickness of a minimum film thickness portion where the film thickness from the surface of the base material to the surface of the colored layer in the opening portion is minimum are measured in each pixel, and a ratio $\alpha$ between an average A of the film thicknesses of the maximum film thickness portions and an average B of the film thicknesses of the minimum film thickness portions in the ten pixels (=B/A) is in the range of 0.5 to 1.0.

* * * * *